United States Patent
Eplett

(10) Patent No.: US 9,927,469 B2
(45) Date of Patent: Mar. 27, 2018

(54) LOG-LINEAR POWER DETECTOR

(71) Applicant: Microsemi Corporation, Aliso Viejo, CA (US)

(72) Inventor: Brian Eplett, Lilburn, GA (US)

(73) Assignee: Microsemi Corporation, Aliso Viejo, CA (US)

( * ) Notice: Subject to any disclaimer, the term of this patent is extended or adjusted under 35 U.S.C. 154(b) by 70 days.

(21) Appl. No.: 14/975,878

(22) Filed: Dec. 21, 2015

(65) Prior Publication Data

US 2016/0178675 A1    Jun. 23, 2016

(51) Int. Cl.
| | |
|---|---|
| G01R 21/00 | (2006.01) |
| G01R 19/22 | (2006.01) |
| G01R 21/10 | (2006.01) |
| H03G 3/30 | (2006.01) |

(52) U.S. Cl.
CPC ............ *G01R 21/00* (2013.01); *G01R 19/22* (2013.01); *G01R 21/10* (2013.01); *H03G 3/3052* (2013.01)

(58) Field of Classification Search
CPC ........ H05G 1/12; H05G 1/18; Y02B 70/1408; H04B 1/0466; H04B 1/0475; H04B 1/1027; H04B 17/20; H04B 17/29; H04B 17/309; H04B 1/26; H04B 17/318; H04B 7/0857; H03G 3/3042; H03G 3/3047; H03G 3/3052; G01R 29/06; G01R 29/0871; H03F 1/3247
USPC ..... 324/119; 455/115.1, 115.2, 226.1, 226.2; 702/189
See application file for complete search history.

(56) References Cited

U.S. PATENT DOCUMENTS

| | | |
|---|---|---|
| 3,668,535 A | 6/1972 | Lansdowne |
| 3,719,831 A | 3/1973 | Hamburg |
| 3,745,374 A | 7/1973 | Hecker et al. |
| 4,209,714 A | 6/1980 | Miyamoto |
| 5,049,829 A | 9/1991 | Garskamp et al. |
| 5,148,117 A | 9/1992 | Talwar |
| 5,338,985 A | 8/1994 | Fotowat-Ahmady et al. |
| 7,274,206 B2 | 9/2007 | Prikhodko et al. |
| 7,948,317 B2 | 5/2011 | Wan |

(Continued)

FOREIGN PATENT DOCUMENTS

| | | |
|---|---|---|
| CN | 101794368 | 8/2010 |
| EP | 0484139 B1 | 8/1996 |

(Continued)

OTHER PUBLICATIONS

Analog Devices; MT-078 Tutorial—High Frequency Log Amps; Published 2009 by Analog Device, Inc.

(Continued)

*Primary Examiner* — Tung X Nguyen
*Assistant Examiner* — Robert P Alejnikov, Jr.
(74) *Attorney, Agent, or Firm* — Simon Kahn

(57) ABSTRACT

A power detector constituted of: a transconductance element arranged to output a rectified detection current, the magnitude thereof arranged to increase exponentially responsive to a linear increase in the amplitude of an input signal; and at least one p-n junction based device, a function of the rectified detection current arranged to flow there through. The output of the power detector is a function of the voltage across the at least one p-n junction based device.

17 Claims, 5 Drawing Sheets

(56) References Cited

U.S. PATENT DOCUMENTS

| | | | |
|---|---|---|---|
| 8,190,107 B1* | 5/2012 | Gilbert | H03D 1/10 455/108 |
| 2003/0054778 A1* | 3/2003 | Hecht | H03F 1/0272 455/115.1 |
| 2003/0199153 A1* | 10/2003 | Kovacic | H03J 1/0008 438/479 |
| 2004/0217807 A1 | 11/2004 | Andle | |
| 2005/0032499 A1* | 2/2005 | Cho | H03G 3/3042 455/343.1 |
| 2005/0237110 A1 | 10/2005 | Parkhurst et al. | |
| 2007/0066250 A1* | 3/2007 | Takahashi | H03G 3/3047 455/127.1 |
| 2009/0021300 A1 | 1/2009 | Romano | |
| 2009/0322312 A1 | 12/2009 | Amborg | |
| 2011/0234322 A1* | 9/2011 | Bowers | H03F 1/302 330/296 |
| 2012/0202441 A1 | 8/2012 | Mimino | |
| 2013/0307624 A1* | 11/2013 | Eplett | H03G 3/004 330/278 |
| 2014/0015604 A1* | 1/2014 | Eschlboeck | H03F 1/0277 330/131 |
| 2014/0085759 A1* | 3/2014 | Richter | H02H 11/003 361/84 |
| 2014/0218106 A1 | 8/2014 | Drogi et al. | |

FOREIGN PATENT DOCUMENTS

| | | |
|---|---|---|
| EP | 1528666 A1 | 5/2005 |
| GB | 2335061 A | 9/1999 |
| JP | 62161207 | 7/1987 |

OTHER PUBLICATIONS

International Search Report for PCT/US2015/066962 dated Apr. 4, 2016 by European Patent Office.

Written Opinion of the International Searching Authority for PCT/US2015/066962 dated Apr. 4, 2016 by European Patent Office.

\* cited by examiner

LOG-LINEAR POWER DETECTOR

TECHNICAL FIELD

The invention relates generally to the field of radio frequency (RF) signal power detectors and in particular to a method and apparatus of linear power detection of RF signals.

BACKGROUND

Many communications and RADAR systems operate at radio frequency (RF) frequencies of Ku Band or higher. In many of these systems it is necessary to continuously monitor and adjust the power level of the transmitted RF signal and the gain of the receiver (or transmitter) in order to compensate for changing link conditions such as atmospheric changes in weather conditions, interference, movement or changes in orientation of the terminals. To accomplish this, RF power levels are sampled using an RF power detector and RF gain or signal levels are adjusted as appropriate.

The output of the power detector is typically a voltage representative of the power of the RF signal. However, there is a square law relationship between power and voltage, given as:

$$P = V^2/R \qquad \text{EQ. 1}$$

where V is the amplitude of the RF signal and R is the resistance presented to the RF signal. As shown in EQ. 1, as the amplitude of the RF signal increases, the resultant power increases exponentially. FIG. 1 illustrates a graph 5 of a typical power detector response, where the x-axis is power in dBm and the y-axis is the output detector voltage in Volts, labelled VDETECT. As shown in graph 5, VDETECT of the power detector exhibits a generally exponential response to a linear increase in the signal power in decibels per milliwatt (dBm). Therefore, at low power intensities the power detector exhibits very low sensitivity, while exhibiting high sensitivity at high power intensities. The change in output voltage is extremely rapid at higher power outputs, which generally exceeds the ability to properly read the signal, which is preferably constrained to be in the range of 200 mV to 800 mV. What is desired, and not provided by the prior art, is a power detector exhibiting an increased dynamic range with similar sensitivity for both low and high power levels.

SUMMARY OF THE INVENTION

Accordingly, it is a principal object of the present invention to overcome the disadvantages of prior art power detectors. This is accomplished in one embodiment by a power detector comprising: a transconductance element arranged to output a rectified detection current, the magnitude thereof arranged to increase exponentially responsive to a linear increase, in dBm, of the power of an input signal; and at least one p-n junction based device, a function of the rectified detection current arranged to flow there through. The output of the power detector is a function of the voltage across the at least one p-n junction based device.

Preferably, such a device provides for a linear relationship between the detector output voltage and the logarithmic expression of the input power.

In some detail, a log-linear power detector is enabled comprising: an input port arranged to receive a radio frequency (RF) power signal; a first transconductance element arranged to receive the RF power signal from the input port, the first transconductance element arranged to output a rectified detection current at an output of the first transconductance element, the magnitude of the rectified detection current arranged to increase exponentially responsive to an exponential increase in the power of the received RF power signal; at least one first p-n junction based device, a predetermined function of the rectified detection current arranged to flow through the at least one first p-n junction based device; and an output circuitry arranged to output a representation of the voltage across the at least one first p-n junction based device.

In one embodiment the power detector further comprises a comparing circuitry, the comparing circuitry arranged to: compare the output voltage representation with a first reference voltage; and output an indication of a difference between the output voltage representation and the first reference voltage. In one further embodiment, the comparing circuitry comprises: a first differential amplifier; and a first bias current source, the first differential amplifier arranged to amplify the difference between a function of the output voltage representation and a function of the first reference voltage responsive to the first bias current source, wherein the first bias current source is arranged to generate a first bias current, the temperature response of the generated first bias current being a predetermined function of the temperature response of the at least one first p-n junction based device such that a non-linearity of the temperature response of the at least one first p-n junction based device is compensated responsive to the first bias current source. In another further embodiment, the power detector further comprises a second p-n junction based device arranged to provide a current path for a first predetermined reference current, the first reference voltage being a function of the voltage across the second p-n junction based device.

In one embodiment, the power detector further comprises: a differential amplifier, a first input of the differential amplifier arranged to receive an indication of the voltage at an output of the first transconductance element and a second input of the differential amplifier arranged to receive a second reference voltage; and an adjustable current path arranged to adjust the magnitude of current flowing therethrough responsive to an output voltage of the differential amplifier, the rectified detection current arranged to flow through the adjustable current path. In one further embodiment the power detector further comprises: a second transconductance element arranged to output a predetermined second reference current; and a bias current cancellation node, wherein the first transconductance element is further arranged to output a predetermined second bias current, a predetermined function of the predetermined second reference current arranged to cancel a predetermined function of the predetermined second bias current at the bias current cancellation node, and wherein the second reference voltage comprises the voltage at an output of the second transconductance element.

In one embodiment the at least one first p-n junction based device comprises a pair of first p-n junction based devices, each of the pair of first p-n junction based devices comprising a diode, the function of the rectified detection current arranged to flow through the pair of diodes. In another embodiment the first transconductance element comprises a bipolar junction transistor (BJT), a base of the BJT arranged to receive the RF power signal and a collector of the BJT arranged to output the rectified detection current. In yet another embodiment the power detector further comprises a current mirror, an input of the current mirror arranged to receive the rectified detection current and an output of the current mirror arranged to output the function of the rectified detection current.

Independently a log-linear power detection method is enabled, the method comprising: receiving a radio frequency (RF) power signal; generating a rectified detection current, the magnitude of the generated rectified detection current arranged to increase exponentially responsive to an exponential increase in the power of the received RF power signal; generating a detection voltage responsive to the generated rectified detection current, the generated detection voltage arranged to increase linearly responsive to an exponential increase in the generated rectified detection current; and outputting a representation of the generated detection voltage.

In one embodiment, the method further comprises: comparing the output voltage representation with a first reference voltage; and outputting an indication of a difference between the output voltage representation and the first reference voltage. In one further embodiment the generated detection voltage comprises a voltage across a first p-n junction based device when a function of the generated rectified detection current is flowing therethrough, and wherein the method further comprises: generating a first bias current, a temperature response of the generated first bias current being a predetermined function of a temperature response of the first p-n junction based device; and amplifying the difference between a function of the output voltage representation and a function of the first reference voltage responsive to the generated first bias current, the comparing responsive to the difference amplification such that a non-linearity of the temperature response of the first p-n junction based device is compensated responsive to the generated first bias current. In another further embodiment the generated detection voltage comprises a voltage across a first p-n junction based device when a function of the generated rectified detection current is flowing therethrough, and wherein the first reference voltage comprises a function of the voltage across a second p-n junction based device when a first predetermined reference current is flowing therethrough.

In one embodiment the rectified detection current is generated by a first transconductance element, and wherein the method further comprises: amplifying a difference between an indication of a voltage at an output of the first transconductance element and a second reference voltage; and responsive to the amplified difference, controlling an adjustable current path to adjust the magnitude of current flowing therethrough, the rectified detection current arranged to flow through the adjustable current path. In one further embodiment, the method further comprises: generating a predetermined second bias current, the generated predetermined second bias current output by the first transconductance element; generating a predetermined second reference current, the generated predetermined second reference current output by a second transconductance element; and cancelling a predetermined function of the generated predetermined second bias current at a bias current cancellation node responsive to the generated predetermined second reference current, wherein the second reference voltage comprises the voltage at an output of the second transconductance element. In another further embodiment, the rectified detection current is generated by a bipolar junction transistor (BJT), a base of the BJT arranged to receive the RF power signal and a collector of the BJT arranged to output the generated rectified detection current.

In one embodiment, the generated detection voltage comprises a voltage across at least one first p-n junction based device when a function of the generated rectified detection current is flowing therethrough. In one further embodiment the at least one first p-n junction based device comprises a pair of first p-n junction based devices, each comprising a diode, the function of the rectified detection current arranged to flow through the pair of diodes.

In one embodiment the generated rectified detection current is arranged to be received at an input of a current mirror, the detection voltage generation further responsive to an output of the current mirror.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1:
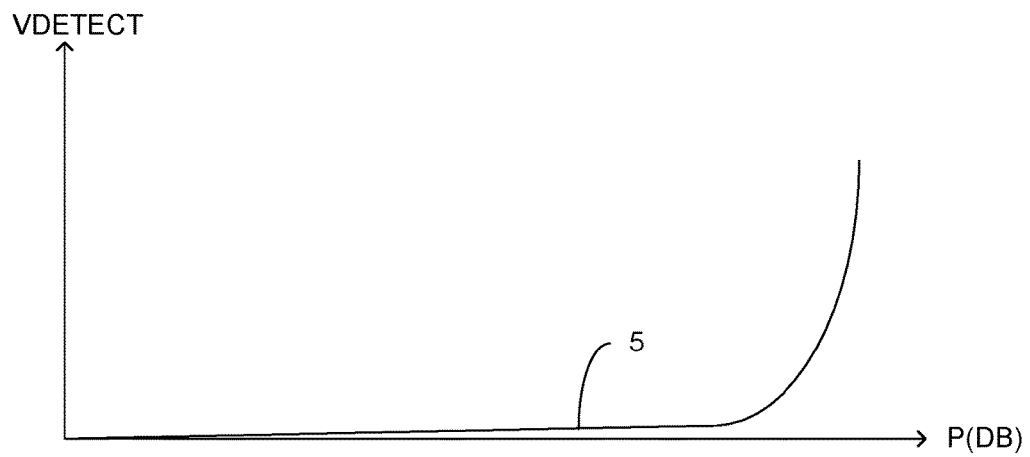
FIG. 1 illustrates a typical prior art power detector response as a function of power.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2:
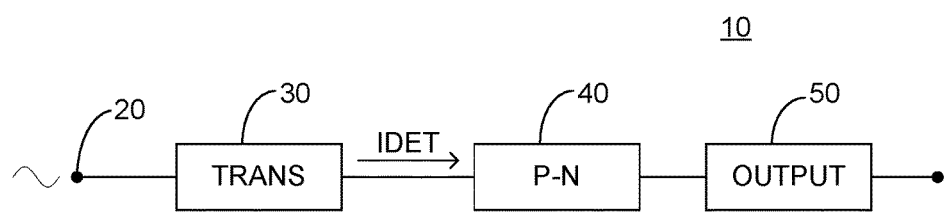
FIG. 2 illustrates a high level schematic diagram of a power detector comprising a transconductance element and a p-n junction based device, according to certain embodiments.

FIG. 2 illustrates a high level schematic diagram of a log-linear power detector 10, according to certain embodiments. Log-linear power detector 10 comprises: an input port 20; a transconductance element 30; a p-n junction based device 40; and an output circuitry 50. A first terminal of transconductance element 30 is coupled to input port 20 and a second terminal of transconductance element 30 is coupled to a first terminal of p-n junction based device 40. A second terminal of p-n junction based device 40 is coupled to a respective input of output circuitry 50. In one embodiment, as will be described below, transconductance element 30 comprises a bipolar junction transistor and p-n junction based device 40 comprises a diode. In one further embodiment, as will be described below in relation to power detector 100, a plurality of p-n junction based devices 40 are provided, each comprising a diode.

In operation, input port 20 is arranged to receive an RF signal. Transconductance element 30 is arranged to output a rectified detection current responsive to the received RF signal. The magnitude of the output rectified detection current, denoted IDET, changes linearly in relation to changes in the amplitude of the incoming RF signal. Detection current IDET flows through p-n junction based device 40, the voltage across p-n junction based device 40 arranged to increase logarithmically responsive to a linear increase in the magnitude of detection current IDET. Output circuitry 50 is arranged to output a representation of the voltage across p-n junction based device 40. As will be described below, the voltage across p-n junction based device 40 exhibits a linear relationship with the logarithmic expression of the power of the incoming RF signal, thereby allowing for an increased dynamic range and allowing for generally equal sensitivity of power detector 10 over the entire range.

Figure 3A:
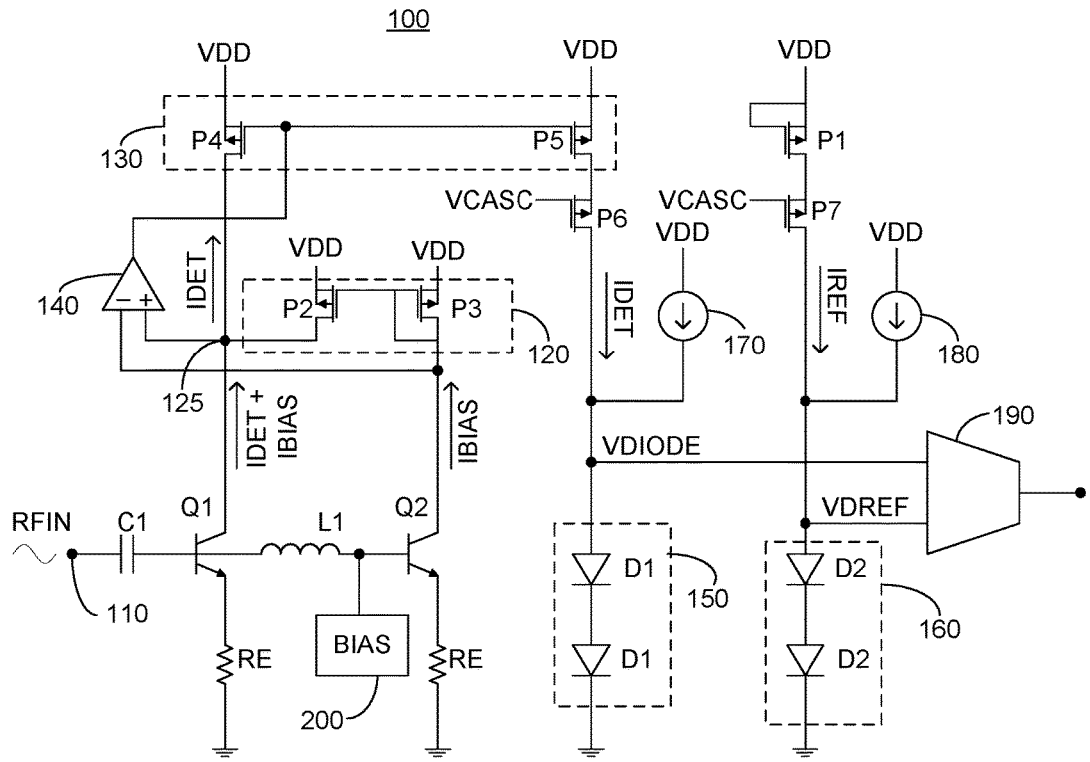
FIG. 3A illustrates a high level schematic diagram of a first embodiment of a power detector comprising a pair of transconductance elements and a p-n junction based device stack, according to certain embodiments.

FIG. 3A illustrates a high level schematic diagram of a log-linear power detector 100, according to certain embodiments. Log-linear power detector 100 comprises: an input node 110; a DC blocking element, illustrated without limitation as a capacitor C1 and described herein as such; a first transconductance element, illustrated without limitation as a BJT Q1 and described herein as such; a second transconductance element, illustrated without limitation as a BJT Q2 and described herein as such; an inductance element, illustrated without limitation as an inductor L1 and described herein as such; a pair of resistive elements, each illustrated without limitation as a resistor RE and described herein as such; a current mirror 120; a current mirror 130; a first differential amplifier 140, illustrated without limitation as an operation amplifier (op-amp) and described herein as such; a first p-n junction based device stack 150 comprising a pair of first p-n junction based devices, each illustrated without limitation as a diode D1 and described herein as such; a second p-n junction based device stack 160 comprising a pair of second p-n junction based devices, each illustrated without limitation as a diode D2 and described herein as such; a first current source 170; a second current source 180; an adjustable current path, illustrated without limitation as a p-channel metal-oxide-semiconductor field-effect-transistor (PFET) P1 and described herein as such; a comparing circuitry 190; and a bias circuitry 200. Current mirror 120 comprises: a pair of adjustable current paths, illustrated without limitation as a PFET P2 and a PFET P3 and described herein as such. Current mirror 130 comprises: a pair of adjustable current paths, illustrated without limitation as a PFET P4 and a PFET P5 and described herein as such. Power detector 100 additionally comprises a pair of adjustable current paths, illustrated without limitation as a PFET P6 and a PFET P7 and described herein as such.

A first end of capacitor C1 is coupled to input port 110. A second end of capacitor C1 is coupled to the base of BJT Q1 and a first end of inductor L1. A second end of inductor L1 is coupled to the base of BJT Q2 and an output of bias circuit 200. The emitter of each of BJT Q1 and BJT Q2 is coupled to a common potential via a respective resistor RE. The collector of BJT Q1 is coupled, at a bias current cancellation node 125, to the drain of PFET P2 of current mirror 120, the drain of PFET P4 of current mirror 130 and the non-inverting input of op-amp 140. The collector of BJT Q2 is coupled to the drain of PFET P3 of current mirror 120, the gate of each of PFET P2 and P3, and the inverting input of op-amp 140. The source of each of PFETs P2 and P3 is coupled to a supply voltage, denoted VDD. The output of op-amp 140 is coupled to the gate of each of PFETs P4 and P5. The source of each of PFETs P4 and P5 is coupled to supply voltage VDD.

The drain of PFET P5 is coupled to the source of PFET P6 and the gate of PFET P6 is coupled to a voltage VCASC. The drain of PFET P6 is coupled to a first terminal of first current source 170, a first input of comparing circuitry 190 and the anode of a first diode D1 of first p-n junction based device stack 150. The cathode of first diode D1 is coupled to the anode of a second diode D1 and the cathode of second diode D1 is coupled to the common potential. A second terminal of first current source 170 is coupled to supply voltage VDD. The source of PFET P1 is coupled to the gate thereof and supply voltage VDD. The drain of PFET P1 is coupled to the source of PFET P7 and the gate of PFET P7 is coupled to voltage VCASC. The drain of PFET P7 is coupled to a first terminal of second current source 180, a second terminal of comparing circuitry 190 and the anode of a first diode D2 of second p-n junction based device stack 160. The cathode of first diode D2 is coupled to the anode of a second diode D2 and the cathode of second diode D2 is coupled to the common potential. A second terminal of second current source 180 is coupled to supply voltage VDD.

In operation, an RF signal, denoted RFIN, is received at input port 110 and capacitor C1 is arranged to block any DC components at input port 110 and feed the DC blocked RFIN signal to the base of BJT Q1. Bias for BJT Q1 is provided by bias circuitry 200 via inductor L1. Q1, responsive to the blocked RFIN signal, generates a detection current through the collector of BJT Q1, the generated detection current denoted IDET, which is very large in relation to the quiescent collector current caused by the bias of bias circuitry 200. Detection current IDET, can not go below zero, and thus is effectively a rectified value, which when integrated over the period of signal RFIN has a magnitude which is linearly related to the peak to peak magnitude of input signal RFIN. As described above in relation to FIG. 1, an exponential increase in the amplitude of RF signal RFIN corresponds to a linear increase in the power of RF signal RFIN when measured in dBm.

Bias circuitry 200 is arranged to output a DC bias voltage. Responsive to the DC bias voltage of bias circuitry 200, BJTs Q1 and Q2 are each arranged to generate a DC bias current through the collector thereof, the DC bias current denoted IBIAS. Current mirror 120 is arranged to draw DC bias current IBIAS from bias current cancellation node 125 and thus cancel the DC bias current IBIAS output by the collector of BJT Q1 at bias current cancellation node 125, such that the drain of PFET P4 receives only rectified detection current IDET. Op-amp 140 is arranged to keep the drain voltages of PFETs P2 and P3 equal by controlling the gate voltage of PFET P4. Inductor L1 acts as an RF choke such that the RF signal does not significantly impact the base of BJT Q2. Advantageously, inductor L1 avoids the disadvantages of having an RF choke comprising a resistor. Particularly, if there would be an RF choke resistor between BJTs Q1 and Q2, DC current being drawn by BJT Q1 from bias circuitry 200 would generate a voltage drop across the RF choke resistor. The DC bias current IBIAS of BJT Q1 would thus be different than the DC bias current IBIAS of BJT Q2, and as a result they would not cancel each other out at bias current cancellation node 125.

Figure 3B:
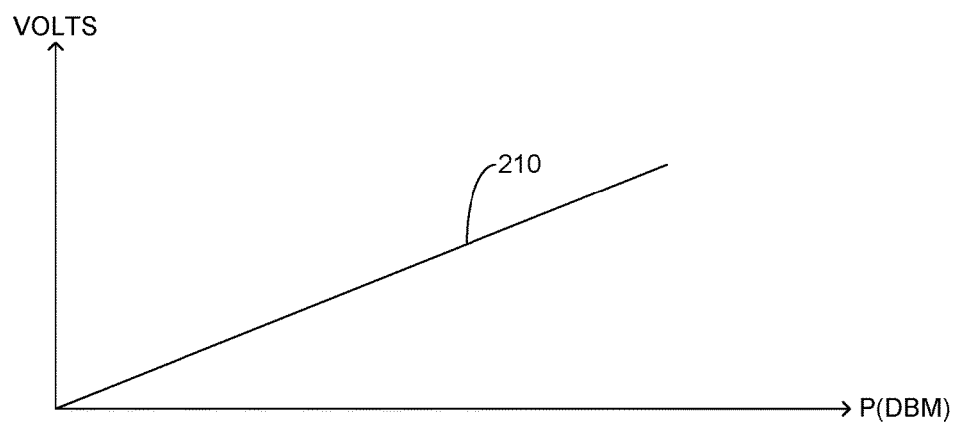
FIG. 3B illustrates a response of the power detector of FIG. 3A as a function of power, in dB.

Rectified detection current IDET is output by PFET P5 of current mirror 130 and flows through diodes D1. The voltage across a diode is given, approximately, as:

$$V_{DIODE} = n*V_T*\ln(I/I_S) \qquad \text{EQ. 2}$$

where n is the ideality factor, $V_T$ is the thermal voltage, I is the current flowing through the diode and $I_S$ is the reverse bias saturation current. Thus, an exponential increase/decrease in the magnitude of rectified detection current IDET causes a linear increase/decrease in voltage VDIODE across diodes D1. As described above, an increase/decrease in the magnitude of rectified detection current IDET is linearly related to an increase/decrease in the amplitude of the input signal RFIN, and as explained in relation to EQ. 1, an increase/decrease in the amplitude of the input signal RFIN corresponds to an exponential increase/decrease in the power of input signal RFIN. As a result, an exponential increase/decrease in the power of RF signal RFIN causes a respective linear increase/decrease in voltage VDIODE. Therefore, there is a linear relationship between the power of the received RF signal RFIN, when measured in dBm, and voltage VDIODE in Volts, as illustrated by graph 210 of FIG. 3B, where the x-axis represents power in dBm and the y-axis represents voltage in Volts.

A reference current IREF is generated through PFET P1, thereby creating a reference voltage VDREF across diodes D2. Voltage VDIODE is compared to reference voltage VDREF by comparing circuitry 190 and the output of comparing circuitry 190 represents the difference between the actual power of input signal RFIN and the desired power of input signal RFIN as determined by VDREF. Advantageously, generating reference voltage VDREF through PFET P1 and diodes D2 provides a more accurate reference voltage than a fixed voltage source. Particularly, by using elements which are substantially identical in structure to PFET P5 and diodes D1, any changes to voltage VDIODE due to temperature and element age, without limitation, similarly affects reference voltage VDREF. In one embodiment, the output of comparing circuitry 190 is received by an analog to digital converter (not shown).

First current source 170 and second current source 180 are arranged to generate DC bias currents, equal to each other, which reduces any variations between bias current IBIAS and reference current IREF. Additionally, PFET P6 is arranged to ensure that the voltage at the drain of PFET P5 equals the voltage at the drain of PFET P4. Particularly, in the absence of PFET P6, the drain voltage of PFET P5 would be biased by the voltage generated across diodes D1. Such a bias is not seen at the drain of PFET P4, therefore since the drain voltages of PFET P5 and PFET P4 will not be equal current mirror 130 will not operate properly. The operation of PFET P6 causes the source voltage thereof, which is also the drain voltage of PFET P5, to be equal to the drain voltage of PFET P4. Single VCASC is selected in accordance with the circuit operating conditions so as to ensure this result. PFETs P1 and P7 are added to the reference stem of second p-n junction based device stack 160 so that the components of the reference stem are substantially identical to the components of the detection stem of first p-n junction based device stack 150.

As described above, first p-n junction based device stack 150 and second p-n junction based device stack 160 each comprise a pair of diodes D1, D2, respectively. Advantageously, using two stacked diodes doubles the sensitivity of voltage VDIODE to changes in rectified detection current IDET. Additionally, using two stacked diodes allows for an increased DC bias of voltages VIDODE and VDREF, thus allowing for an improved circuit for comparing circuitry 190, as will be described below. The above has been described where first p-n junction based device stack 150 and second p-n junction based device stack 160 each comprises diodes, however this is not meant to be limiting in any way and other p-n junction based devices, such as transistors, may be utilized without exceeding the scope.

Figure 4:
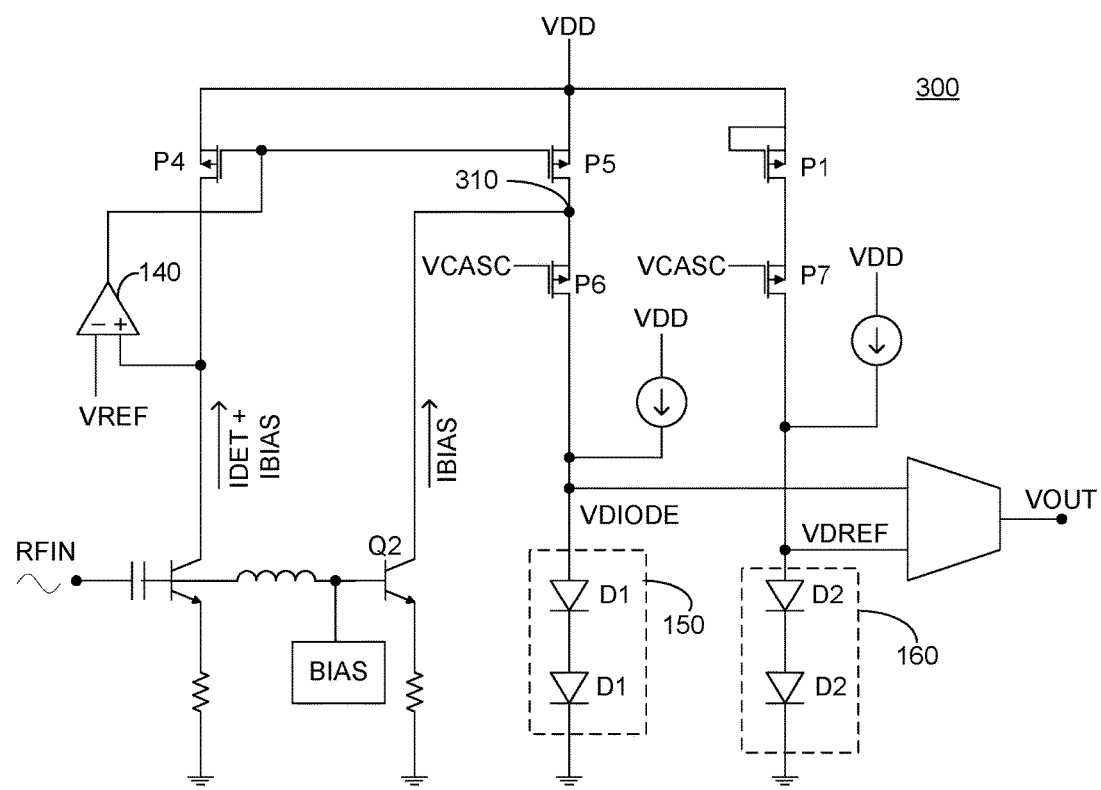
FIG. 4 illustrates a high level schematic diagram of a second embodiment of a power detector comprising a pair of transconductance elements and a p-n junction based device stack, according to certain embodiments.
Figure 5:
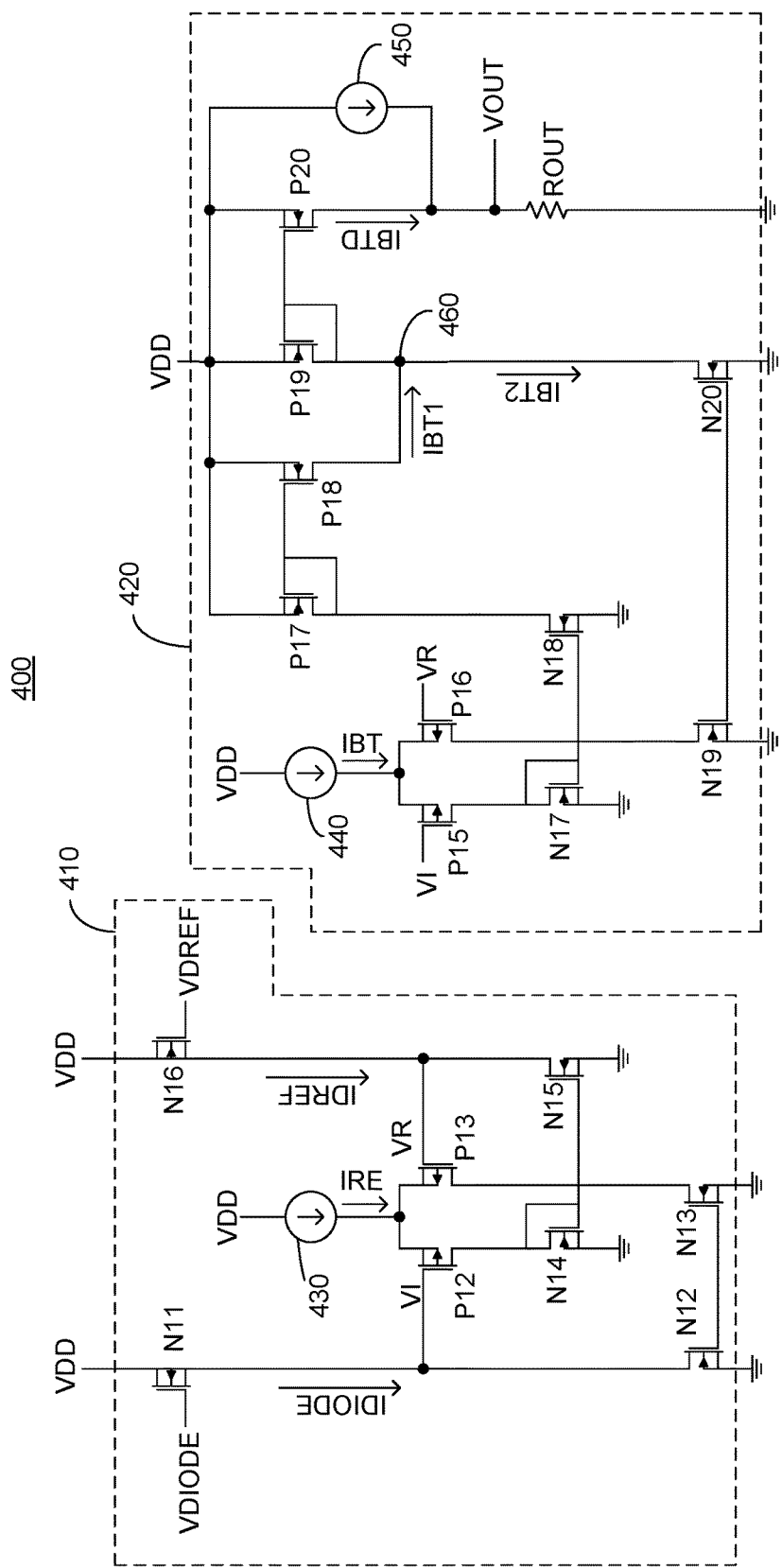
FIG. 5 illustrates a high level schematic diagram of a comparing circuitry, according to certain embodiments.

FIG. 4 illustrates a high level schematic diagram of a power detector 300, according to certain embodiments. Power detector 300 is in all respects similar to power detector 100 of FIG. 3A, with the exception that current mirror 120 is not provided and the inverting input of op-amp 140 is coupled to a reference voltage VREF. The operation of power detector 300 is in all respects similar to the operation of power detector 100 of FIG. 3A, with the exception that bias current IBIAS is cancelled at bias current cancellation node 310.

FIG. 4 illustrates a high level schematic diagram of a comparing circuitry 400, according to certain embodiments. In one embodiment, comparing circuitry 190 of power detector 100 is implemented as comparing circuitry 400. Comparing circuitry 400 comprises: a dynamic range extender 410; and a temperature compensation circuitry 420. Dynamic range extender 410 comprises: a plurality of first controllable current paths P12 and P13, illustrated as PFETs and described herein as such; a plurality of second controllable current paths N11, N12, N13, N14, N15 and N16, illustrated as n-channel metal-oxide-semiconductor field-effect-transistors (NFETs) and described herein as such; and a current source 430. Temperature compensation circuitry 420 comprises: a plurality of first controllable current paths P15, P16, P17, P18, P19 and P20, illustrated as PFETs and described herein as such; a plurality of second controllable current paths N17, N18, N19 and N20, illustrated as NFETs and described herein as such; a current source 440; a current source 450; and an output resistive element ROUT, illustrated as a resistor and described herein as such.

The gate of NFET N11 is arranged to receive voltage VDIODE, i.e. the detected voltage across first p-n junction based device 150. The drain of NFET N11 is coupled to supply voltage VDD and the source of NFET N11 is coupled to the gate of PFET P12 and the drain of NFET N12. The source of NFET N12 is coupled to a common potential and the gate of NFET N12 is coupled to the gate of NFET N13. The source of NFET N13 is coupled to the common potential and the drain of NFET N13 is coupled to the drain of PFET P13. The source of PFET P13 is coupled to an output of current source 430 and the source of PFET P12. An input of current source 430 is coupled to supply voltage VDD. The drain of PFET P12 is coupled to the drain of NFET N14 and the gate of each of NFETs N14 and N15. The source of each of NFETs N14 and N15 is coupled to the common potential. The drain of NFET N15 is coupled to the gate of PFET P13 and the source of NFET N16. The drain of NFET N16 is coupled to supply voltage VDD and the gate of NFET N16 is arranged to receive voltage VDREF, i.e. the voltage across second p-n junction based device 160.

The gate of PFET P15 is coupled to the gate of PFET P12, the voltage thereat denoted VI. The gate of PFET P16 is coupled to the gate of PFET P13, the voltage thereat denoted VR. The output of current source 440 is coupled to the source of each of PFETs P15 and P16, and the input of current source 440 is coupled to supply voltage VDD. The drain of PFET P15 is coupled to the drain of NFET N17 and the gate of each of NFETs N17 and N18. The source of each of NFETs N17 and N18 is coupled to the common potential. The drain of NFET N18 is coupled to the drain of PFET P17 and the drain of each of PFETs P17 and P18. The source or each of PFETs P17 and P18 is coupled to supply voltage VDD. The drain of PFET P16 is coupled to the drain of NFET N19. The source of NFET N19 is coupled to the common potential and the gate of NFET N19 is coupled to the gate of NFET N20. The source of NFET N20 is coupled to the common potential. The drain of NFET N20 is coupled to the drain of each of PFETs P18 and P19, and the gate of each of PFETs P19 and P20, at node 460. The source of each of PFETs P19 and P20 is coupled to supply voltage VDD. The drain of PFET P20 is coupled to an output of current source 450 and a first end of resistor ROUT. A second end of resistor ROUT is coupled to the common potential and an input of current source 450 is coupled to supply voltage VDD.

In operation, dynamic range extender 410 is arranged to increase the difference between voltage VDIODE and voltage VDREF by a predetermined amount, such that the difference between voltages VI and VR equals the difference between voltages VDIODE and VDREF after being increased by the predetermined amount, responsive to the current generated by current source 430 denoted IRE. Particularly, the difference between voltages VDIODE and VDREF creates a corresponding difference between voltages VI and VR, which in turn determines the ratio between the portion of current IRE flowing through PFET P12 and the portion of current IRE flowing through PFET P13. In the event that voltage VDIODE is greater than voltage VDREF, the portion of current IRE flowing through PFET P13 is greater than the portion of current IRE flowing through PFET P12. In the event that voltage VDIODE is less than voltage VDREF, the portion of current IRE flowing through PFET P12 is greater than the portion of current IRE flowing through PFET P13.

The portion of current IRE flowing through PFET P12 is added to the current of NFET N16 via the current mirror constituted of NFETs N14 and N15, the current of NFET N16 denoted IDREF. The portion of current IRE flowing through PFET P13 is added to the current of NFET N11 via the current mirror constituted of NFETs N12 and N13, the current of NFET N11 denoted IDIODE. When voltage VDIODE is greater than voltage VDREF, a greater portion of current IRE is added to current IDIODE than is added to current IDREF, thereby increasing the difference between IDIODE and IDREF. As a result, voltage VI increases by a greater value than the increase of voltage VR. When voltage VDIODE is less than voltage VDREF, a greater portion of current IRE is added to current IDREF than is added to current IDIODE, thereby increasing the difference between IDIODE and IDREF. As a result, voltage VR increases by a greater value than the increase of voltage VI. Thus, the difference between voltages VI and VR equals the difference between voltages VDIODE and VDREF after being increased by a predetermined amount, responsive to current IRE.

Temperature compensation circuitry 420 is arranged to compensate for the temperature effect on voltage VDIODE. Particularly, the operation of diodes D1 of first p-n junction based device stack 150 of FIG. 3A is affected by the diode temperature of the constituent diodes thereof. As a result, for any detection current IDET, the value of voltage VDIODE will change responsive to temperature. As described above in relation to EQ. 3, voltage VDIODE is a function of the thermal voltage $V_T$ of diodes D1, voltage VDIODE increasing responsive to an increase in thermal voltage $V_T$. Thermal voltage $V_T$ is given as:

$$V_T = (k*T)/q \qquad \text{EQ. 4}$$

where k is the Boltzmann constant, q is the elementary charge and T is the temperature of diode D1. Therefore, voltage VDIODE increases responsive to an increase in temperature T and decreases responsive to a reduction in temperature T.

The current generated by current source 440, denoted IBT, provides a bias for the current generated at PFETs P15, P16 by voltages VI, VR, respectively. Current IBT is generated such that the magnitude thereof decreases responsive to an increase in temperature and increases responsive to a decrease in temperature, thereby compensating for the change in VDIODE and VDREF as a result of the temperature. In one embodiment, the derivative of the magnitude of current IBT as a function of temperature is determined according to the derivative of the current of diodes D1 and D2 as a function of temperature.

As described above in relation to current IRE, a first portion of current IBT flows through PFET P15 and a second portion of current IBT flows through PFET P16, the ratio of the first portion to the second portion responsive to the ratio of voltage VI to voltage VR. A representation of the first portion of current IBT, denoted IBT1, is output to node 460 via the current mirror constituted of NFETs N17 and N18, and the current mirror constituted of PFETs P17 and P18. A representation of the second portion of current IBT, denoted IBT2, is output to node 460 via the current mirror constituted of NFETs N19 and N20. A representation of the difference between currents IBT1 and IBT2, denoted IBTD, is output by the current mirror constituted of PFETs P19 and P20.

In the event that voltage VI is greater than voltage VR, i.e. voltage VDIODE is greater than voltage VDREF, current IBT2 is greater than current IBT1. As a result, current IBTD is added to the current output by current source 450, which flows through resistor ROUT, thereby voltage VOUT is greater than the voltage generated from the current of current source 450 flowing through resistor ROUT.

In the event that voltage VI is less than voltage VR, i.e. voltage VDIODE is less than voltage VDREF, current IBT1 is greater than current IBT2. As a result, current IBTD is subtracted from the current output by current source 450, which flows through resistor ROUT, thereby voltage VOUT is less than the voltage generated from the current of current source 450 flowing through resistor ROUT.

As described above, first and second p-n junction based device stacks 150, 160 each comprise a plurality of diodes. Advantageously, the bias voltage of the plurality of diodes allows for proper operation of dynamic range extender 410 and temperature compensation circuitry 420.

Figure 6:
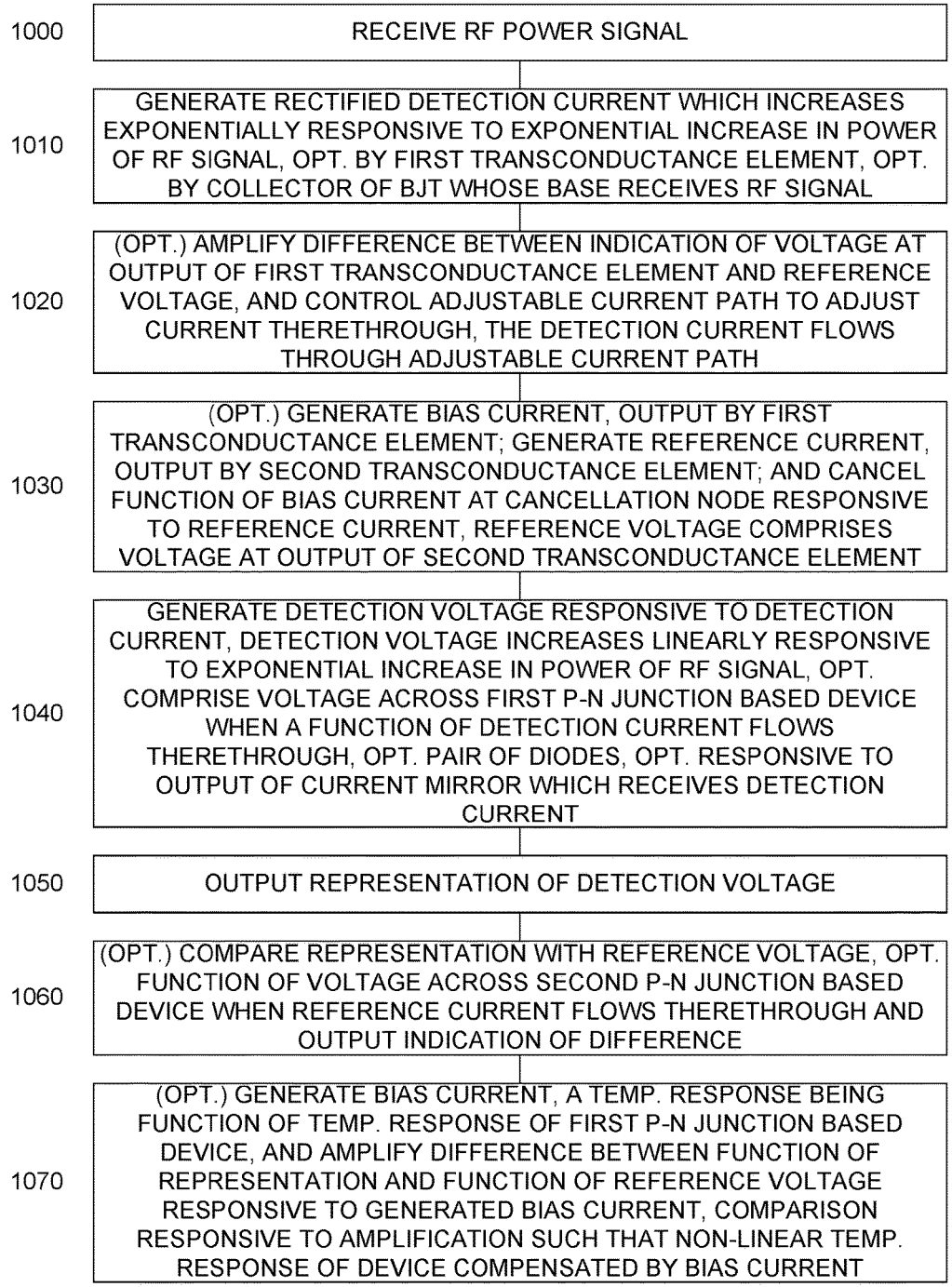
FIG. 6 illustrates a high level schematic diagram of a log-linear power detection method, according to certain embodiments.

FIG. 6 illustrates a high level flow chart of a log-linear power detection method, according to certain embodiments.

In stage 1000, an RF power signal is received. In stage 1010, a rectified detection current is generated. The magnitude of the generated rectified detection current increases/decreases linearly with the amplitude of the received RF power of stage 1000, and thus increase/decreases exponentially responsive to an exponential increase/decrease in the power of the received RF power signal of stage 1000. Optionally, the rectified detection current is generated by a first transconductance element. Optionally, the first transconductance element is a bipolar junction transistor (BJT), the base of the BJT arranged to receive the RF power signal and the rectified detection current being the collector current of the BJT.

In optional stage 1020, the difference between a reference voltage and an indication of the voltage at an output of the optional first transconductance element of stage 1010 is amplified. An adjustable current path is controlled, responsive to the amplified difference, to adjust the magnitude of current flowing therethrough. The generated rectified detection current of stage 1010 flows through the adjustable current path.

In optional stage 1030, a bias current is generated. The bias current is output by the optional first transconductance element of stage 1010. Additionally, a reference current is generated, the reference current output by a second transconductance element, the reference voltage of optional stage 1020 comprising the voltage at an output of the second transconductance element. A function of the generated bias current is cancelled at a bias current cancellation node responsive to the generated reference current. Optionally, the generated bias current is cancelled at the bias current cancellation node by a current output by a current mirror whose input receives the generated reference current.

In stage 1040, a detection voltage is generated responsive to the generated rectified detection current of stage 1010. The generated detection voltage exhibits a logarithmic relationship to the rectified detection current of stage 1010, and thus increases/decreases linearly responsive to an exponential increase/decreases in the power of the receive RF signal of stage 1000. When the power of the received RF power signal is measured in decibels, the generated detection voltage increases/decreases linearly responsive to a linear increase/decrease in the dBm of the received RF power signal. Optionally, at least one first p-n junction based device is provided, a function of the generated rectified detection current arranged to flow therethrough. The generated detection voltage comprises the voltage across the at least one first p-n junction based device when the function of the generated rectified detection current flows therethrough. Optionally, the function of the generated rectified detection current comprises a current generated at an output a current mirror whose input receives the generated rectified detection current. Optionally, the at least one first p-n junction based device comprises a diode. Further optionally, the at least one first p-n junction based device comprises a serially connected pair of first p-n junction based devices, each comprising a diode, the cathode of a first of the pair of diodes coupled to the anode of the second of the pair of diodes.

In stage 1050, a representation of the generated detection voltage of stage 1040 is output. In optional stage 1060, the detection voltage representation of stage 1050 is compared with a reference voltage, different than the reference voltage of optional stage 1020. Optionally, at least one second p-n junction based device is provided, a reference current, different than the generated reference current of optional stage 1030, arranged to flow therethrough. The reference voltage comprises a function of the voltage across the at least one second p-n junction based device when the reference current flows therethrough. Optionally, the at least one second p-n junction based device comprises a diode. Further optionally, the at least one second p-n junction based device comprises a pair of second p-n junction based devices, each comprising a diode. An indication of the difference between the detection voltage representation and the reference voltage is output.

In optional stage 1070, a bias current is generated, different than the bias current of optional stage 1030, the temperature response of the generated bias current being a function of the temperature response of the at least one first p-n junction based device of stage 1040. Additionally, the difference between a function of the detection voltage representation of stage 1050 and a function of the optional reference voltage of optional stage 1060 is amplified responsive to the generated bias current. The comparison of optional stage 1060 is responsive to the amplification of optional stage 1070 such that a non-linearity of the temperature response of the at least one first p-n junction based device of stage 1040 is compensated responsive to the generated bias current.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

The invention claimed is:

1. A log-linear power detector comprising:
   an input port arranged to receive a radio frequency (RF) power signal having an amplitude;
   a first transconductance element arranged to receive said RF power signal from said input port, said first transconductance element arranged to output a rectified detection current at an output of said first transconductance element, said first transconductance element arranged such that the magnitude of said rectified detection current varies linearly in relation to the amplitude of said received RF power signal;
   at least one first p-n junction based device, a representative current representative of said rectified detection current arranged to flow through said at least one first p-n junction based device; and an output circuitry arranged to output a representation of the voltage drop across said at least one first p-n junction based device, wherein said at least one first p-n junction based device comprises a pair of serially connected diodes, said representative current representative of said rectified detection current arranged to flow through said pair of serially connected diodes.

2. The power detector of claim 1, further comprising a comparing circuitry, said comparing circuitry arranged to:

compare said output voltage representation with a first reference voltage; and output an indication of a difference between said output voltage representation and said first reference voltage.

3. The power detector of claim 2, wherein said comparing circuitry comprises:

a first differential amplifier; and a first bias current source, said first differential amplifier arranged to amplify the difference between a function of said output voltage representation and a function of said first reference voltage responsive to said first bias current source, wherein said first bias current source is arranged to generate a first bias current, the temperature response of said generated first bias current being a predetermined function of the temperature response of said at least one first p-n junction based device such that a non-linearity of the temperature response of said at least one first p-n junction based device is compensated responsive to said first bias current source.

4. The power detector of claim 2, further comprising a second p-n junction based device arranged to provide a current path for a first predetermined reference current, said first reference voltage being a function of the voltage across said second p-n junction based device.

5. The power detector of claim 1, further comprising:

a differential amplifier, a first input of said differential amplifier arranged to receive an indication of the voltage at an output of said first transconductance element and a second input of said differential amplifier arranged to receive a second reference voltage; and an adjustable current path arranged to adjust the magnitude of current flowing therethrough responsive to an output voltage of said differential amplifier, said rectified detection current arranged to flow through said adjustable current path.

6. The power detector of claim 5, further comprising:

a second transconductance element arranged to output a predetermined second reference current; and a bias current cancellation node, wherein said first transconductance element is further arranged to output a predetermined second bias current, a predetermined function of said predetermined second reference current arranged to cancel a predetermined function of said predetermined second bias current at said bias current cancellation node, and wherein said second reference voltage comprises the voltage at an output of said second transconductance element.

7. The power detector of claim 1, wherein said first transconductance element comprises a bipolar junction transistor (BJT), a base of said BJT arranged to receive said RF power signal and a collector of said BJT arranged to output said rectified detection current.

8. The power detector of claim 1, further comprising a current mirror, an input of said current mirror arranged to receive said rectified detection current and an output of said current mirror arranged to output said representation of said rectified detection current.

9. A log-linear power detection method, the method comprising:

receiving a radio frequency (RF) power signal having an amplitude;

generating a rectified detection current, the magnitude of said generated rectified detection current arranged to vary linearly in relation to the amplitude of said received RF power signal;

generating a detection voltage responsive to said generated rectified detection current, said generated detection voltage arranged to vary linearly responsive to an exponential change in said generated rectified detection current, wherein said generated detection voltage comprises a voltage drop across at least one first p-n junction based device when a representative current representative of said generated rectified detection current is flowing therethrough, said at least one first p-n junction based device comprising a pair of serially connected diodes; and outputting a representation of said generated detection voltage.

10. The method of claim 9, further comprising:

comparing said output voltage representation with a first reference voltage; and outputting an indication of a difference between said output voltage representation and said first reference voltage.

11. The method of claim 10, wherein the method further comprises:

generating a first bias current, a temperature response of said generated first bias current being a predetermined function of a temperature response of the at least one first p-n junction based device; and amplifying the difference between a function of said output voltage representation and a function of said first reference voltage responsive to said generated first bias current, said comparing responsive to said difference amplification such that a non-linearity of the temperature response of the at least one first p-n junction based device is compensated responsive to said generated first bias current.

12. The method of claim 10, wherein said first reference voltage comprises a representation of the voltage drop across a second p-n junction based device when a first predetermined reference current is flowing therethrough.

13. The method of claim 9, wherein said rectified detection current is generated by a first transconductance element, and wherein the method further comprises:

amplifying a difference between an indication of a voltage at an output of the first transconductance element and a second reference voltage; and responsive to said amplified difference, controlling an adjustable current path to adjust the magnitude of current flowing therethrough, said rectified detection current arranged to flow through the adjustable current path.

14. The method of claim 13, further comprising:

generating a predetermined second bias current, said generated predetermined second bias current output by the first transconductance element;

generating a predetermined second reference current, said generated predetermined second reference current output by a second transconductance element; and cancelling a predetermined function of said generated predetermined second bias current at a bias current cancellation node responsive to said generated predetermined second reference current, wherein said second reference voltage comprises the voltage at an output of the second transconductance element.

15. The method of claim 13, wherein said rectified detection current is generated by a bipolar junction transistor (BJT), a base of the BJT arranged to receive said RF power signal and a collector of the BJT arranged to output said generated rectified detection current.

16. The method of claim 9, wherein said generated detection voltage comprises a voltage across at least one first p-n junction based device when a representation of said generated rectified detection current is flowing therethrough.

17. The method of claim 9, wherein said generated rectified detection current is arranged to be received at an input of a current mirror, said detection voltage generation further responsive to an output of the current mirror.

* * * * *